(12) United States Patent
Daubenspeck et al.

(10) Patent No.: US 6,496,053 B1
(45) Date of Patent: Dec. 17, 2002

(54) CORROSION INSENSITIVE FUSIBLE LINK USING CAPACITANCE SENSING FOR SEMICONDUCTOR DEVICES

(75) Inventors: Timothy Daubenspeck, Colchester, VT (US); Kurt R. Kimmel, Jericho, VT (US); William A. Klaasen, Underhill, VT (US); William T. Motsiff, Essex Junction, VT (US); Rosemary A. Previti-Kelly, Burlington, VT (US); W David Pricer, Charlotte, VT (US); Jed H. Rankin, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/416,977

(22) Filed: Oct. 13, 1999

(51) Int. Cl.$^7$ .......................... H01L 29/00; H01L 23/58; H01L 21/82; H01L 21/8249; H02B 1/18

(52) U.S. Cl. ...................... 327/525; 257/529; 257/532; 257/516; 257/173; 257/665; 257/910; 257/530; 361/628; 361/630; 438/132; 438/215; 438/467

(58) Field of Search ................................ 257/529, 532, 257/516, 173, 665, 910, 530; 361/628, 630; 438/132, 215, 467

(56) References Cited

U.S. PATENT DOCUMENTS

| | | | |
|---|---|---|---|
| 4,001,610 A | | 1/1977 | Griffin |
| 4,193,106 A | * | 3/1980 | Coleman ..................... 361/275 |
| 4,687,951 A | * | 8/1987 | McElroy ..................... 307/269 |
| 4,714,949 A | | 12/1987 | Simmons et al. |
| 5,021,920 A | | 6/1991 | Smith |
| 5,264,725 A | * | 11/1993 | Mullarkey et al. .......... 257/665 |
| 5,266,829 A | | 11/1993 | Hamdy et al. |
| 5,331,196 A | | 7/1994 | Lowrey et al. |
| 5,387,812 A | | 2/1995 | Forouhi et al. |
| 5,394,294 A | * | 2/1995 | Mei et al. ................. 361/275.3 |
| 5,406,232 A | | 4/1995 | Hashimoto et al. |
| 5,411,917 A | | 5/1995 | Forouhi et al. |
| 5,444,597 A | * | 8/1995 | Blake et al. ................. 361/234 |
| 5,618,750 A | * | 4/1997 | Fukuhara et al. ........... 438/601 |
| 5,625,219 A | * | 4/1997 | Takagi ........................ 257/530 |
| 5,742,555 A | | 4/1998 | Marr et al. |
| 5,756,393 A | | 5/1998 | Dennison |
| 5,760,674 A | | 6/1998 | Gilmour et al. |
| 5,780,918 A | | 7/1998 | Aoki |
| 5,795,819 A | | 8/1998 | Motsiff et al. |
| 5,811,869 A | | 9/1998 | Seyyedy et al. |
| 5,861,647 A | * | 1/1999 | Zhao et al. .................. 257/296 |
| 5,896,059 A | * | 4/1999 | Durham et al. ................ 326/38 |
| 5,917,763 A | * | 6/1999 | Mullarky ............... 365/185.13 |
| 6,008,523 A | * | 12/1999 | Narayan et al. ............. 257/529 |
| 6,064,108 A | * | 5/2000 | Martinez ..................... 257/532 |
| 6,087,889 A | * | 11/2000 | Mok .......................... 327/525 |
| 6,160,302 A | * | 12/2000 | Palagonia .................... 257/529 |
| 6,163,488 A | * | 12/2000 | Tanizaki et al. ............. 365/200 |
| 6,235,557 B1 | * | 5/2001 | Manley ....................... 438/132 |
| 6,259,146 B1 | * | 7/2001 | Guist .......................... 257/529 |
| 6,296,779 B1 | * | 10/2001 | Clark et al. ..................... 216/2 |

FOREIGN PATENT DOCUMENTS

| | | | |
|---|---|---|---|
| JP | 02-184008 | * | 7/1990 |
| JP | 10-274585 | * | 10/1998 |
| JP | 2001-311135 | * | 3/2001 |

* cited by examiner

Primary Examiner—David E. Graybill
Assistant Examiner—James Mitchell
(74) Attorney, Agent, or Firm—McGinn & Gibb, PLLC; Howard J. Walter, Jr., Esq.

(57) ABSTRACT

A structure and method for a programming device or a fuse includes a capacitive circuit having a capacitance which is alterable. The capacitive circuit can include a first capacitor, a fuse link connected to the first capacitor and a second capacitor connected to the fuse link, wherein removing a portion of the fuse link changes the capacitance.

6 Claims, 11 Drawing Sheets

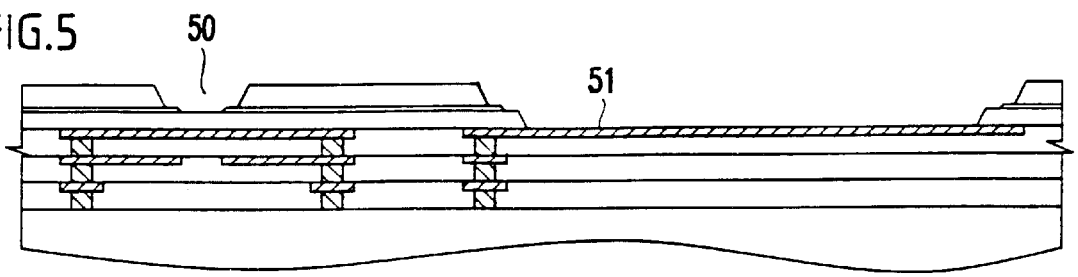
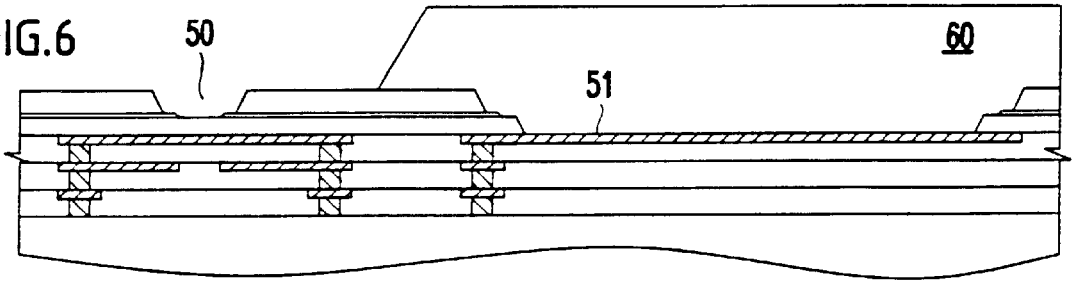
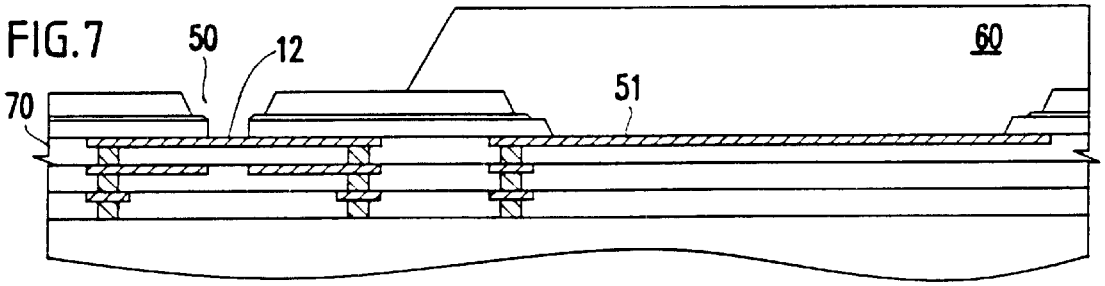
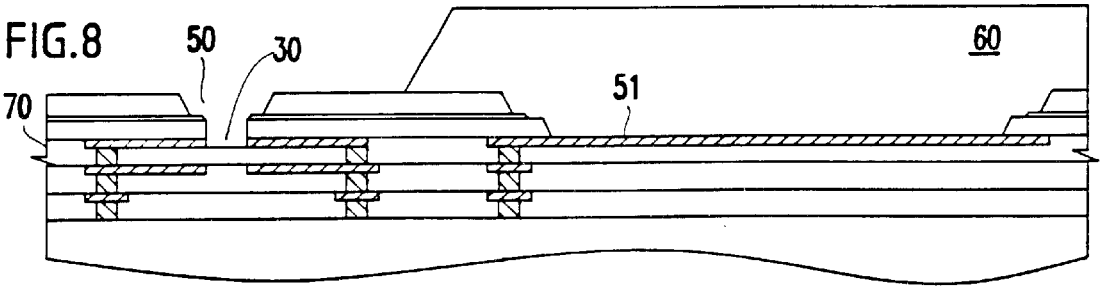
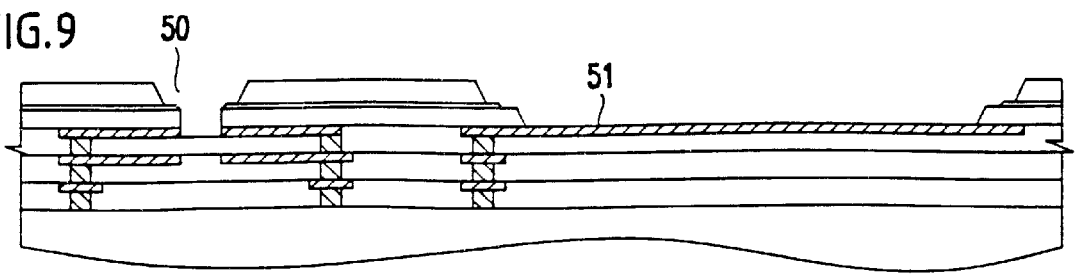

CORROSION INSENSITIVE FUSIBLE LINK USING CAPACITANCE SENSING FOR SEMICONDUCTOR DEVICES

BACKGROUND OF THE INVENTION

1. Field of the Invention

The present invention generally relates to fuses and more particularly to a capacitor fuse structure.

2. Description of the Related Art

Conventional systems utilize fuses in semiconductor chips to provide redundancy, electrical chip identification and customization of function. For designs having three (or more) layers of wiring, the fuses are typically formed from a segment of one of the wiring layers, e.g. the "last metal" or "last metal minus one" wiring layer. Fusing (i.e. deletion of a segment of metal fuse line) is accomplished by exposing the segment to a short, high intensity pulse of "light" from an infra-red laser. The metal line absorbs energy, superheats, melts, expands, and ruptures any overlaying passivation. The molten metal then boils, vaporizes or explodes out of its oxide surroundings, disrupting line continuity and causing high electrical resistance. A "sensing" circuit is used to detect fuse segment resistance. Sense circuits can be designed to "understand" that fusing has occurred when line resistance increases or line resistance decreases.

Because of line to line coupling which slows signal propagation, there is a trend for the inter level dielectric (ILD) to be comprised of polyimide nanofoams or porous glass. These dielectrics are of a class characterized by having low dielectric constant (K). They are not solid materials and will be damaged or collapse under standard laser fuse blow conditions, leading to unreliability and possibly yield degradation of the integrated circuit device.

To improve signal propagation, high conductance materials, e.g. copper, silver, etc., may be used to define device wiring lines (conductors). More specifically, electrical resistance is reduced by using copper or other high conductance materials. Several of the common high conductance materials corrode easily and if fuse structures are formed from segments of wiring lines, corrosion and the attendant degradation of device reliability can be expected if the blown fuse is left exposed.

Also, conventional laser blowing (or even electrical blowing) may damage the fragile, porous ILD, causing it to collapse and change its dielectric constant. The laser fusing could also release particles of copper into the porous films, presenting potential reliability concerns and possibly compromising the basic local structural integrity of the chip.

Therefore, there is a need for a new type of fuse structure which can be blown (e.g., opened) without suffering the reliability problems associated with conventional fuses.

SUMMARY OF THE INVENTION

It is, therefore, an object of the present invention to provide a corrosion insensitive structure and method for a programming device or a fuse that includes a capacitive circuit having a capacitance which is alterable. The capacitive circuit can include a first capacitor, a fuse link connected to the first capacitor and a second capacitor connected to the fuse link, wherein removing a portion of the fuse link changes the capacitance.

The first capacitor includes a first top plate and the second capacitor includes a second top plate. The first top plate, the second top plate and the fuse link are positioned in one planar conductive level within the device. The structure also includes an insulator over the fuse link. The fuse link has a length greater than a spot size of the energy light source used to open the insulator. The invention also includes a sensing circuit for detecting a change in the capacitance. The first capacitor and the second capacitor can be stacked capacitors, inter-digitated capacitors or parallel spiral patterned capacitors.

The invention also includes a process for programming a capacitive device having a first capacitor and a second capacitor connected by a fuse link. The process includes removing an insulator above the fuse link and etching the fuse link. The etching comprises one of wet etching and dry etching. The insulator can be removed using light energy, such as laser and ultra violet light. The light energy is below an energy level required to delete the fuse link. The method may also include sensing a change in capacitance of the capacitive device.

In another embodiment, the invention is a process for programming a capacitive device having at least two inter-digitated capacitors. The process alters an insulator above one of the inter-digitated capacitors to change a capacitance of the device. Such altering can include densifying or removing the insulator by applying one of a laser and ultra violet light to the insulator. Also the process can include sensing a change in capacitance of the device.

Another embodiment of the invention is a semiconductor fuse including a capacitor having a first and a second node (the first node being electrically connected to a sensing circuit for sensing a change in capacitance, and the second node being electrically insulated from ground by a narrow dielectric filled gap device), and a charge collection plate for charging the capacitor, coupled to the second node of the capacitor. The capacitor includes two parallel plates separated by a dielectric layer. The narrow dielectric gap device can be conductive lines separated by a dielectric material or a field effect transistor. The capacitor could be a silicon trench capacitor.

Yet another embodiment is a method of fusing a semiconductor device, which includes providing a capacitor having a first and a second node (the first node being electrically connected to a sensing circuit for sensing a change in capacitance, and the second node being electrically insulated from ground by a narrow dielectric filled gap), providing a charge collection plate coupled to the second node, and inducing a charge across the first and second node of the capacitor sufficient to electrically break down the narrow dielectric gap.

With the invention, a circuit may be programmed by altering its capacitance. Further, the invention opens fusible links using an etching process which substantially reduces or eliminates the possibility of affecting structures adjacent the fusible link. This structure and process is superior to conventional fuses because very low level energy sources such as a low power laser, ultraviolet light or a reactive ion etching process can be utilized to blow the fuse. The energy level utilized by the invention does not cause the fuse material to explode or boil as conventional fuse and processes do. Therefore, blowing the fuse does not damage the surrounding dielectric material. Further, if any of the fuse material remains, it will not corrode or detract from the reliability of the remaining circuit.

Thus, the invention expands the usefulness of programmable and fusible devices and increases the manufacturing yield of circuits which include such devices.

BRIEF DESCRIPTION OF THE DRAWINGS

The foregoing and other objects, aspects and advantages will be better understood from the following detailed description of a preferred embodiment of the invention with reference to the drawings, in which:

FIG. 5 is a schematic diagram of a side view of a portion of the integrated circuit IC) device structure with processing for blowing the capacitive fuse according to the invention;

FIG. 6 is a schematic diagram of a side view of a portion of the IC device structure with processing for blowing the capacitive fuse according to the invention;

FIG. 7 is a schematic diagram of a side view of a portion of the IC device structure with processing for blowing the capacitive fuse according to the invention;

FIG. 8 is a schematic diagram of a side view of a portion of the IC device structure with processing for blowing the capacitive fuse according to the invention;

FIG. 9 is a schematic diagram of a side view of a portion of the IC device structure with processing for blowing the capacitive fuse according to the invention;

DETAILED DESCRIPTION OF PREFERRED EMBODIMENTS OF THE INVENTION

Figure 1:
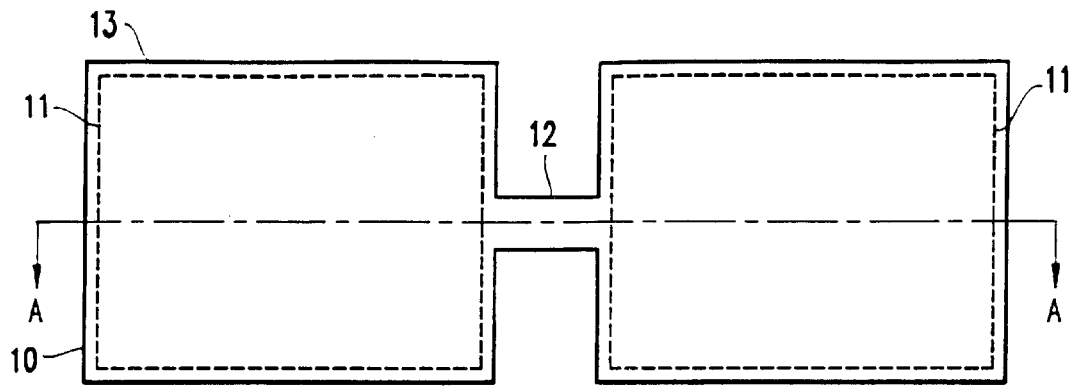
FIG. 1 is a schematic diagram of a top view of the capacitive fuse according to the invention.

The invention combines the ability to quickly and selectively form openings in a low K dielectric of a vertical stack capacitor structure to produce a novel capacitive fuse. Referring now to the drawings, various embodiments of the invention are illustrated.

FIG. 1 is a top view of the inventive fuse after completion of wafer fabrication. Two upper plates 10 of two stacked capacitors 13 are connected by a conductive link 12. Positioned underneath the upper plates 10 are two lower plates 11 of the two capacitors 13 each with connections leading to sensing circuits. The capacitive fuse includes at least two of such capacitors 13 in series.

Figure 2:
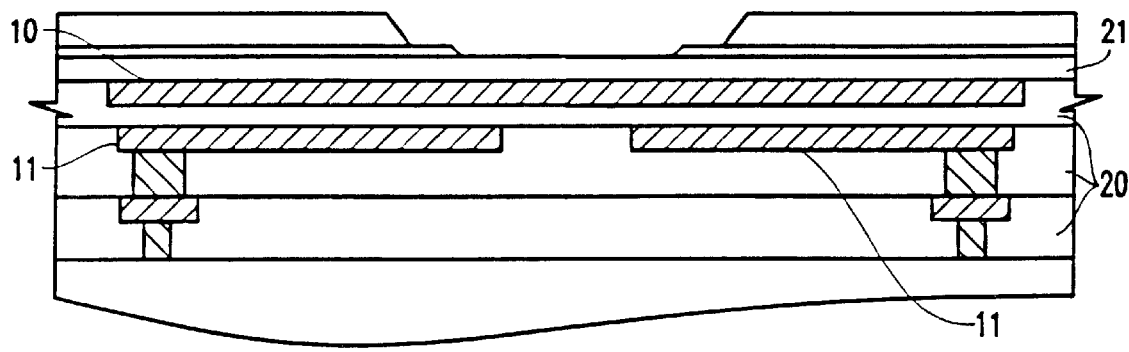
FIG. 2 is a schematic diagram of a side view of the capacitive fuse according to the invention.

FIG. 2 is a side view thru section AA of FIG. 1. A dielectric layer 20 is disposed in a middle layer between the upper 10 and lower layers 11, and a porous dielectric layer 21 is disposed over said upper layer 10. The insulators referred to herein can be any well known low K dielectric and are preferably a closed cell porous or foam dielectric such as polyimide nanofoams, porous glasses, etc. Similarly, the conductive plates 10, 11 could comprise any conductor such as metal, alloy, polysilicon, etc.

Figure 3A:
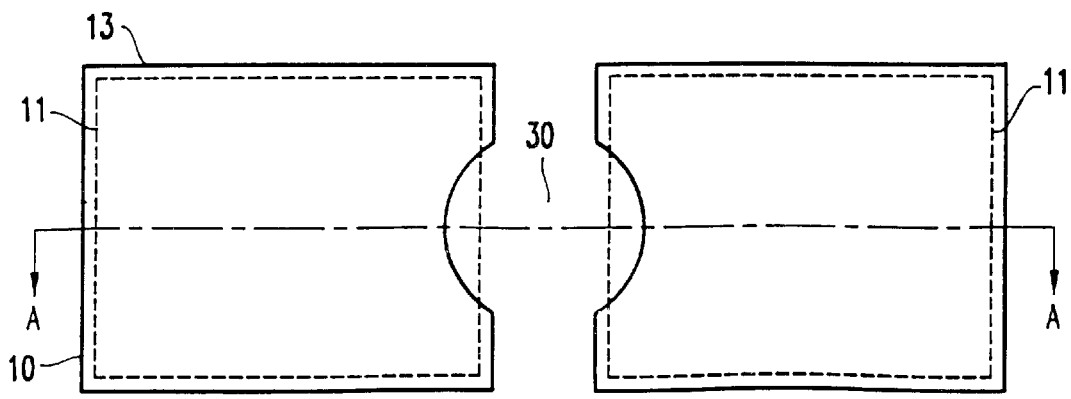
FIG. 3A is a schematic diagram of a top view of the capacitive fuse according to the invention where the fuse link is opened.
Figure 3B:
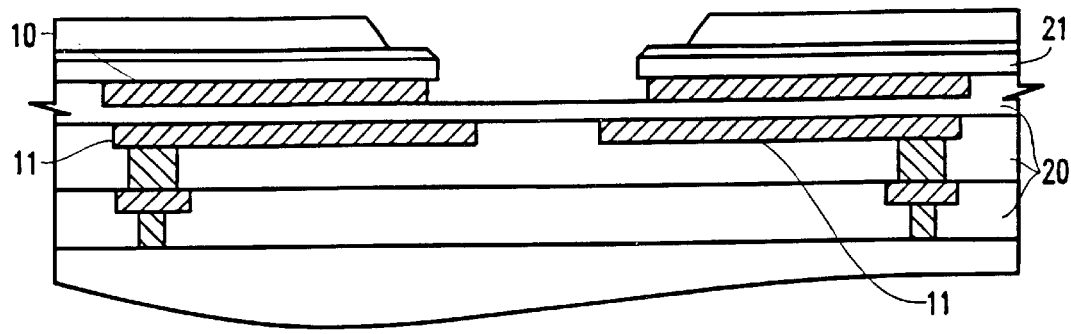
FIG. 3B is a schematic diagram of a side view of the capacitive fuse according to the invention where the fuse link is opened.

FIG. 3A is top view of the fuse shown in FIG. 1 after the fuse has been "blown" 30 by severing the link 12 between the two capacitors 13. FIG. 3B is a side view thru section AA of the blown fuse shown in FIG. 3A.

Figure 4A:
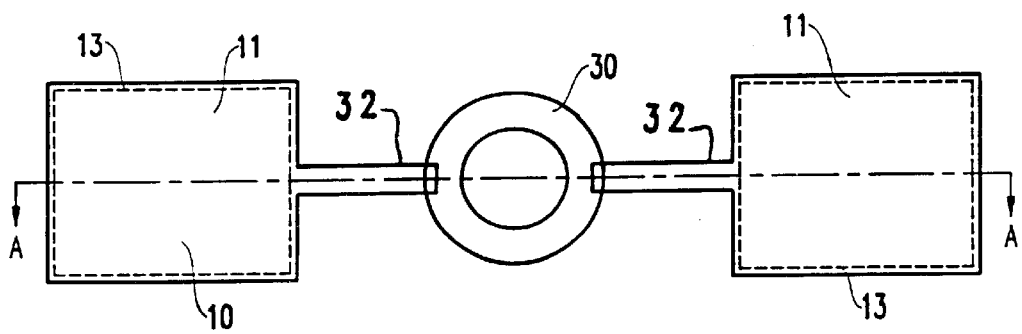
FIG. 4A is schematic diagram of a top view of the capacitive fuse according to a second embodiment of the invention where the fuse link is opened.
Figure 4B:
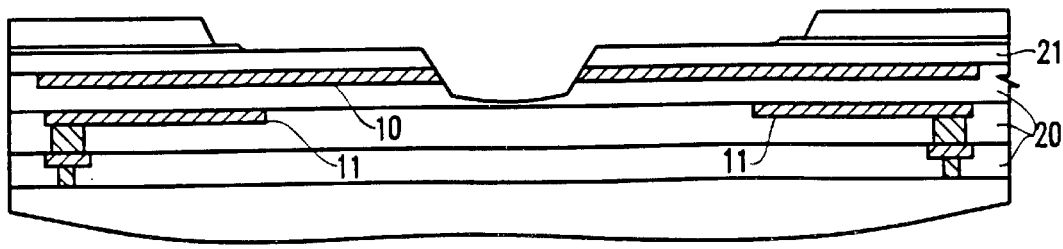
FIG. 4B is a schematic diagram of a side view of the capacitive fuse according to a second embodiment of the invention where the fuse link is opened.

FIGS. 4A and 4B illustrate another embodiment of the invention which includes a fuse link 32 which is substantially longer than the fuse link 12 shown in FIGS. 3A and 3B. More specifically, the fuse link 32 in FIGS. 4A and 4B is at least equal to the width of the amount of material that will be removed from the insulator (e.g., the light source spot size 30) during the blowing of the fuse link 32 and is preferably $\leq 1.5$ times the width of the spot size. The additional length of the fuse link 32 in this embodiment reduces the chance that either of the adjacent capacitor structures 13 will be affected during the opening of the fuse.

The inventive method of blowing the fuse link is illustrated in FIGS. 5–9. In FIG. 5, a fuse 50 (such as the capacitive fuse shown in FIG. 1) and a pad are shown. In FIG. 6, a protective resist 60 is applied to cover the pads 51.

In FIG. 7, the low K dielectric 20 over the link 12 between capacitors 13 has been ablated to expose link 12 using a laser of an appropriate wavelength (150 nm–400 nm). While the link 12 could be removed using a laser at the same time as the low K dielectric, or after the dielectric has been opened, it is preferred to remove the link by etching to minimize damage to the low K dielectric. The energy of the laser, the length of the link 12 or the wiring design may be adjusted to ensure that no metal lying under the level of the link 12 is exposed.

In FIG. 8, the fuse link 12 is etched and removed, thus completing the fuse "blow" 30. Etching may be "wet", using a solution appropriate to the metal wiring, e.g. a solution containing ammonium persulfate if the wiring is copper or "dry", e.g reactive ion etch (RIE) using an etchant gas containing $BCL_3$ if the wiring is aluminum. A sequence of "wet" and "dry" etches may also be used. Fuse link 12 and its associated plates (FIG. 1) are physically isolated from the remainder of the integrated circuit device wiring. So long as the link 12 remains electrically open, corrosion of the remaining plates does not impact the performance of the fuse or the reliability of the integrated circuit device.

This etching process is selective to the underlying insulator. In other words, the chemical etching solution (or RIE) removes the conductive material of the fuse link 12 at a much higher rate than it removes the insulator material. Therefore, the invention substantially reduces the probability that any underlying (or surrounding) structures will be affected by the fusing process. While specific etchants are mentioned above, other similar selective etching processes, well known to those ordinarily skilled in the art, can be used depending upon the conductor/insulator makeup and upon the specific application involved.

In FIG. 9, the resist 60 is stripped away and conventional processing is continued to complete the structure. For example, if the final metal is copper, steps need be taken to protect the pad 51 from direct exposure to resist 60 by using a protective film over the pad.

FIGS. 10A, 11A, 12 and 13 are schematic diagrams of exemplary sensing circuits which can be used with the invention. However, the invention is not limited to the sensing circuits shown and, as would be known by one ordinarily skilled in the art given this disclosure, any circuit which senses the change in capacitance of the fuse may be used successfully with the invention.

Figure 10A:
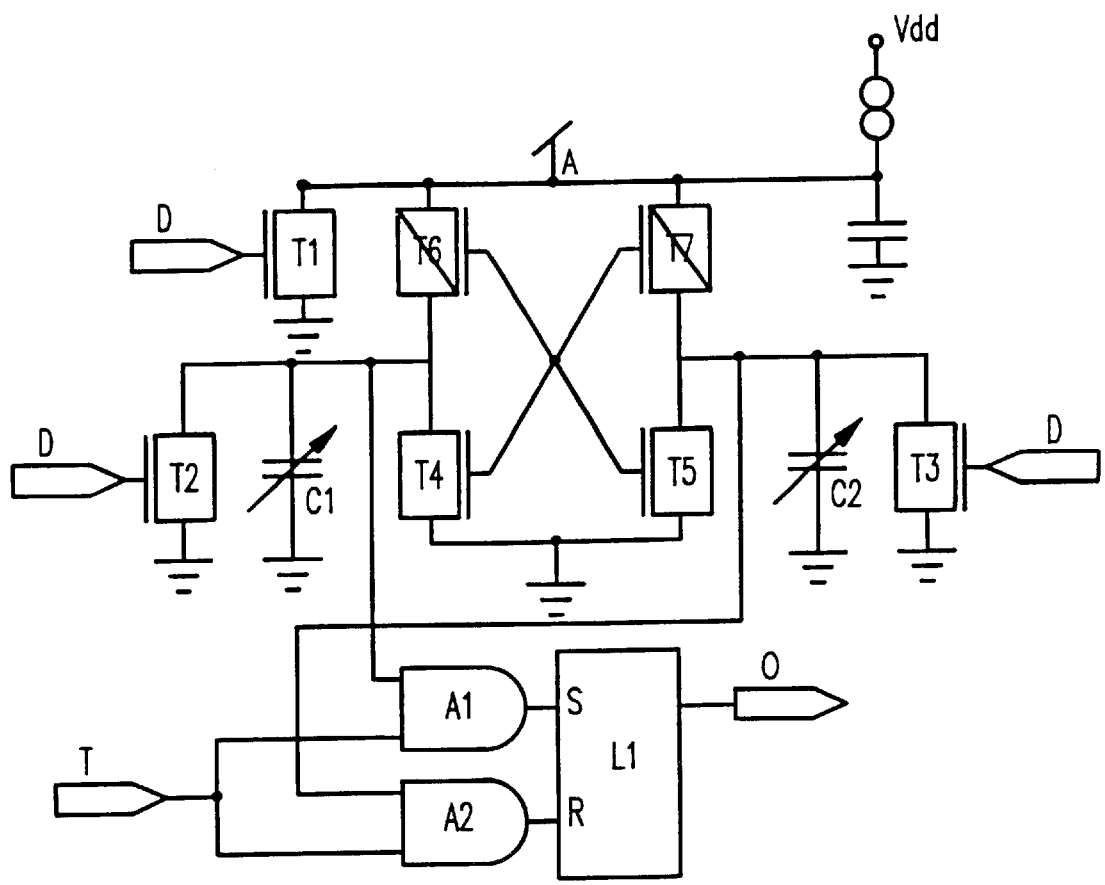
FIG. 10A is a schematic diagram of a sensing circuit according to the invention.
Figure 10B:
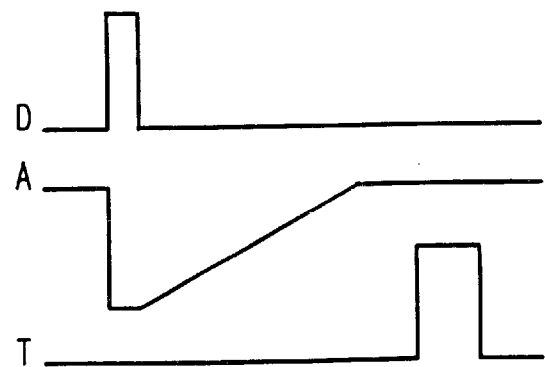
FIG. 10B is a timing diagram produced by the sensing circuit in FIG. 10A.

FIG. 10A senses a difference in capacitance by comparing two rates of rise in voltage. The pulse on node D as seen in FIG. 10B resets the drain nodes of transistors T4 and T5 to zero volts. The voltage ramp on node A as seen also in FIG. 10B rises until transistors T6 and T7 begin to weakly conduct. Small differences in capacitances C1 and C2 produce a small voltage difference between the drain nodes on transistors T4 and T5. When transistors T4 and T5 begin to conduct, that difference is amplified. When the amplified difference is sufficiently large, a pulse on node T sets latch L1 into the corresponding state.

Figure 11A:
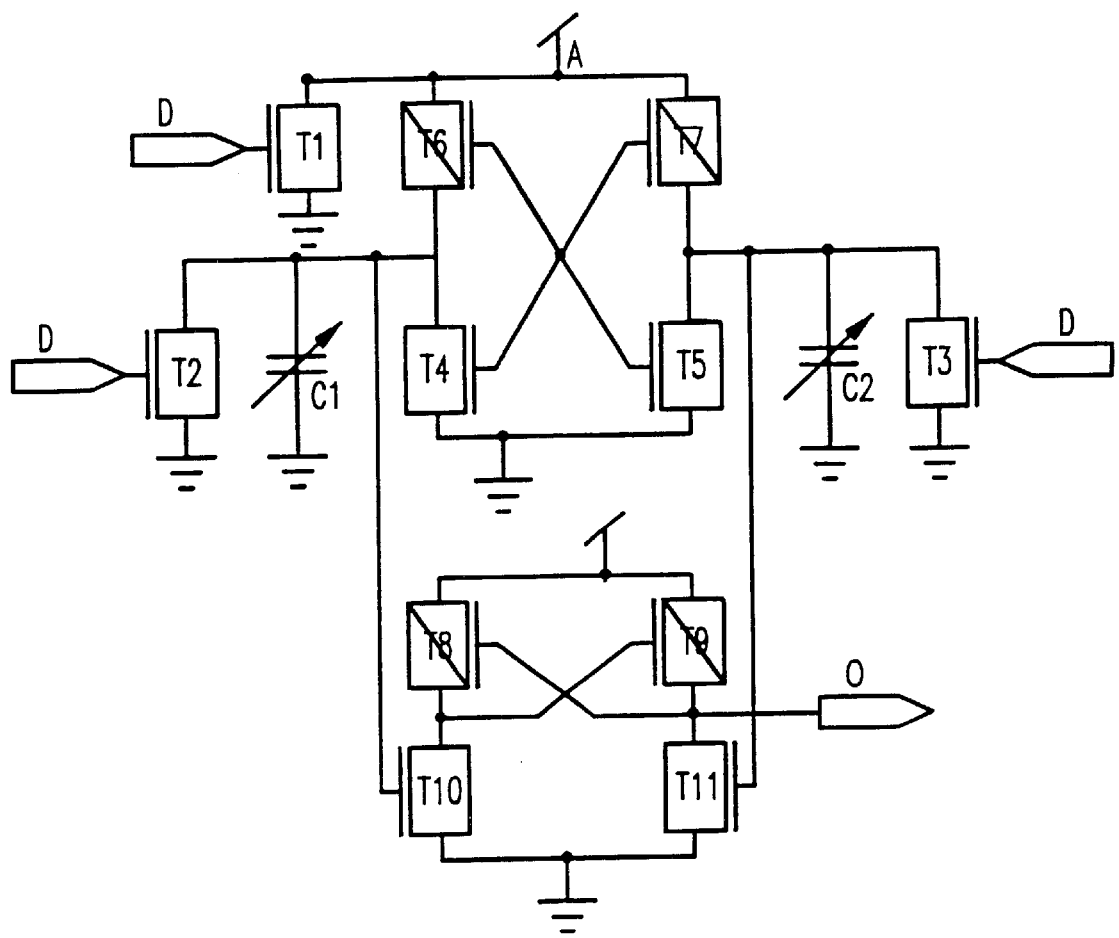
FIG. 11A is a schematic diagram of a sensing circuit according to the invention.
Figure 11B:
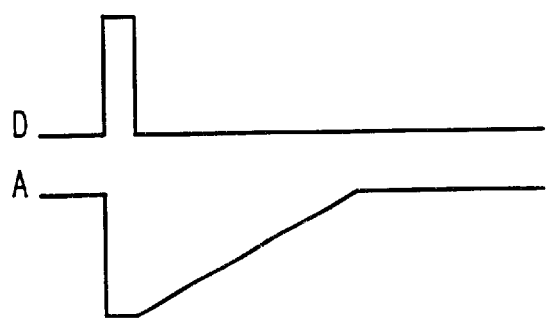
FIG. 11B is a timing diagram produced by the sensing circuit in FIG. 10A.

FIGS. 11A–11B operates in a similar manner to that of FIGS. 10A–10B. In FIG. 11A, however, no set pulse from node T is needed. Instead, transistors T8, T9, T10 and T11 act as a slave latch which follows the signals seen on the drains of transistors T4 and T5. During the reset state when node D is positive, the output node O is undefined. The slave latch is set into its proper state shortly after transistors T4 and T5 begin to conduct.

Figure 12:
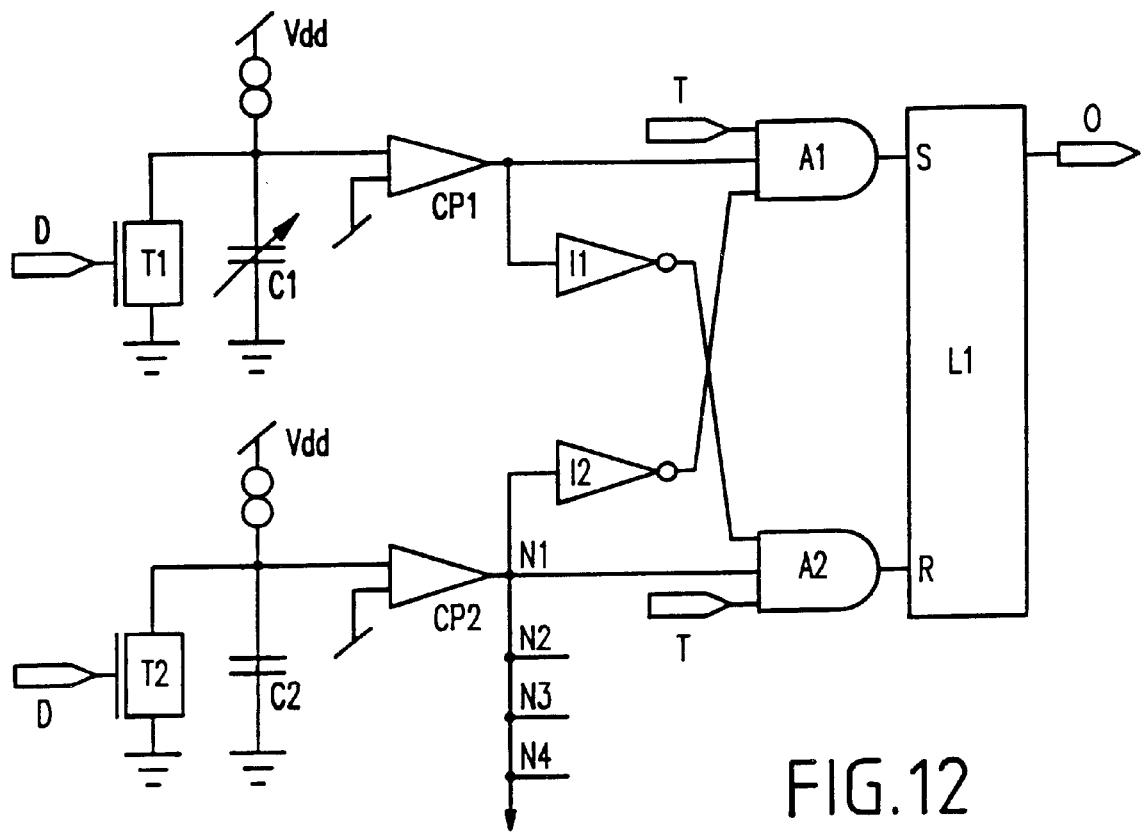
FIG. 12 is a schematic diagram of a sensing circuit according to the invention.

In FIG. 12, the pulse on node D first reset the voltages on capacitors C1 and C2 to zero volts. Two constant current sources gradually change the voltages on these two capacitors. The value of capacitor C1 will be either larger or smaller than that of capacitor C2. Therefore, comparator CP1 will reach its threshold sooner or later than comparator CP2. A pulse on node T provides a time window in which to compare the outputs of CP1 and CP2. If CP1 reaches its threshold first, conditions will be right at the inputs to AND gate A1 to set latch L1. If CP2 reaches its threshold first, conditions will be right at the inputs to AND gate A2 to reset latch L1. During intermediate time periods latch L1 will remember its last state.

Figure 13:
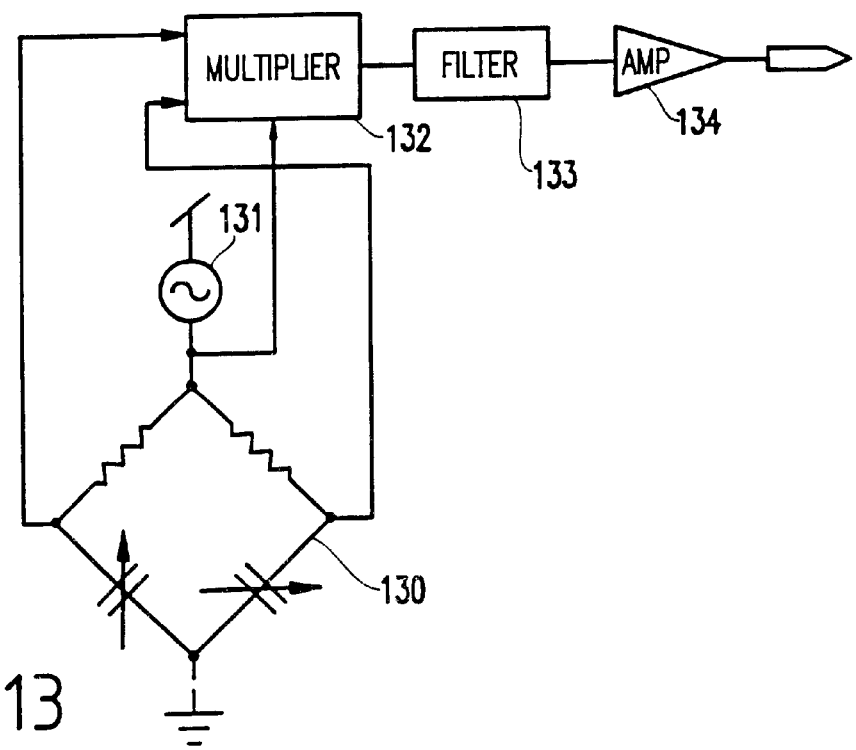
FIG. 13 is a schematic diagram of a sensing circuit according to the invention.

FIG. 13 shows a circuit which includes a bridge/rectifier circuit 130, AC current source 131, multiplier 132, filter 133 and an amplifier 134. FIG. 13 illustrates a detection system derived from radio frequency techniques. An alternating voltage signal is applied to the bridge circuit 130. The two outputs of the bridge 130 are fed differentially to the multiplier 132 where they are compared in phase with the original alternating voltage signal. The output of the multiplier 132 will have a DC component which reflects the alternating voltage difference as seen at the outputs of the bridge circuit 130. The filter 133 removes the alternating voltage signal.

In order to allow for process variations in fabrication, a fuse capacitance to sensing circuit capacitance ratio of 10:1 is preferred. However, a 5:1 ratio could be tolerated with the circuits shown in FIGS. 10A–13. The following numerical example illustrates one of many possible operations of the invention. As would be known by one ordinarily skilled in the art, the invention is not limited to the following, but is useful with any size or type structure which utilizes fuses.

The following example is a capacitive fuse for $0.25\mu$ sized technology. A four transistor sense amplifier with 10:1 transistors would have 18.5 ffds input capacitance ($0.25\mu \times 250\mu \times 4 \times 7.5$ ffds). In this example, total capacitance of the fuse capacitor should be 185 ffds. Each capacitor in the fuse should then be 370 ffds. Assuming $1\mu$ of dielectric between the plates, the fuse capacitance is estimated at 0.08 ffds/$1.0\mu^2$. This yields a $2 \times 4687\mu^2$ plate area, or two sets of plates, each being $68\mu$ on a side. This would allow up to 15% fuse to fuse capacitance variation which is much greater than the less than 5% fuse to fuse capacitance variation expected for close proximity capacitive structures.

Thus, and shown above, the invention changes the capacitance of a fuse and senses the capacitance change utilizing a variety of sensing circuits. As would be known by one ordinarily skilled in the art given this disclosure, the invention is not limited to the foregoing structure or sensing circuits and is equally applicable to any structure and sensing circuit which utilizes fuses. For example, FIGS. 14–20 illustrate additional capacitive structure forms which the invention can take.

Figure 14:
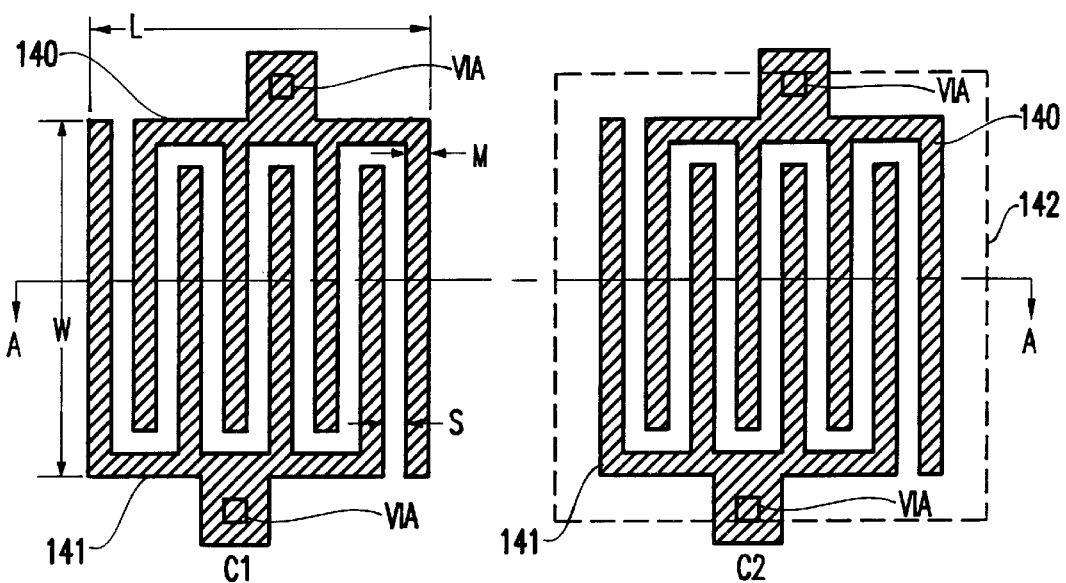
FIG. 14 is a schematic diagram of a top view of the capacitive fuse according to a another embodiment of the invention.

More specifically, FIG. 14 is a top view of two horizontal plate capacitors C1 and C2. They include inter-digitated plates 140 and 141. The metal width is again identified as M and the insulator space between metal lines as S. The structure covers an area W×L.

An area represented by dotted rectangle 142 around capacitor C2 is exposed to an ultraviolet laser, infra-red source or other similar low energy light source capable of coupling with the dielectric foam 150. The insulator/light source is selected such that the low energy light source will density the dielectric 150 causing it to collapse as shown in cross-section in FIG. 15. Collapse is accomplished by raising the dielectric above its glass transition temperature (Tg). Glass transition temperatures for polymide nanofoams are typically <500° C. More specifically, in FIG. 15, the dielectric foam 150 is porous in areas identified by number 151 and has collapsed and densified in the area identified as 152. However, the dielectric 152 still covers the plates 140, 141. This densification increases capacitance, as discussed below.

Figure 16:
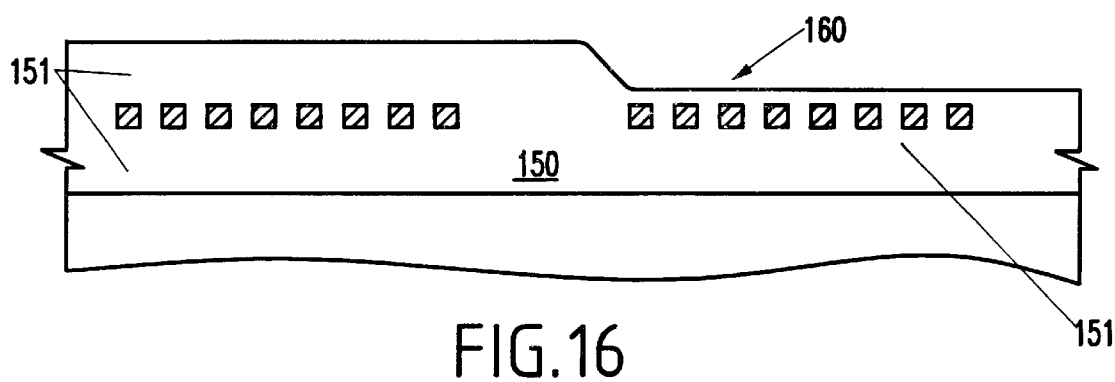
FIG. 16 is a schematic diagram of a side view of the capacitive fuse shown in FIG. 14.

To the contrary, in FIG. 16, the dielectric foam 152 has been substantially removed in area 160. For example, as shown above, conventional masking and etching techniques can be used to selectively remove the insulating material from the area identified as 142 in FIG. 14. While some densification may occur when the dielectric is being removed, the majority of the process is simply to remove the dielectric 150. This removal of the insulator decreases capacitance, as discussed below. In a preferred embodiment a very thin layer of the dielectric remains over the lines 140, 141 to prevent corrosion of the interdigitated structure.

Figure 15:
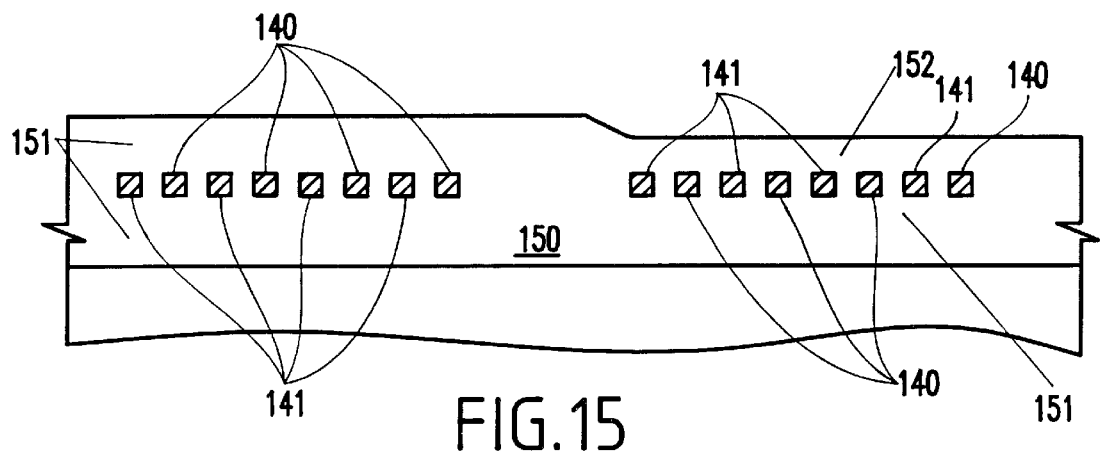
FIG. 15 is schematic diagram of a side view of the capacitive fuse shown in FIG. 14.
Figure 17:
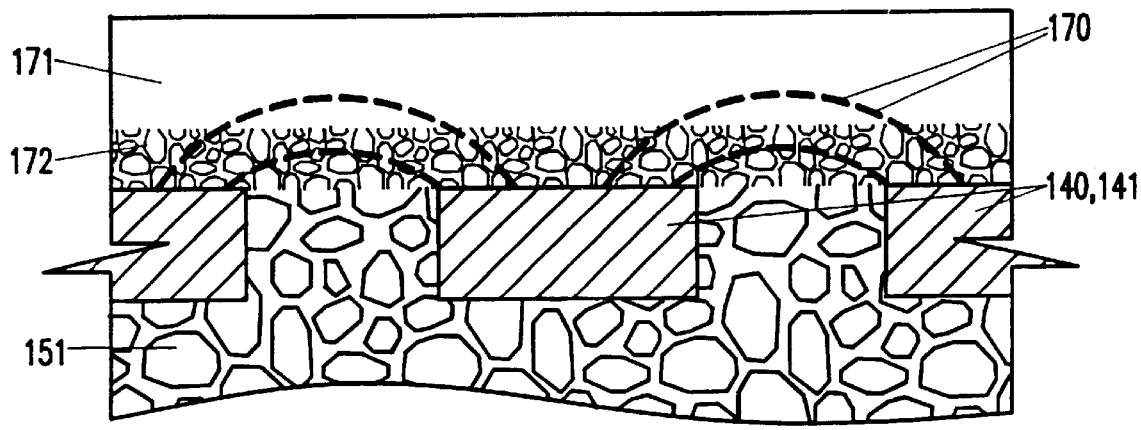
FIG. 17 is a schematic diagram of an enlarged side view of the capacitive fuse shown in FIG. 15.
Figure 18:
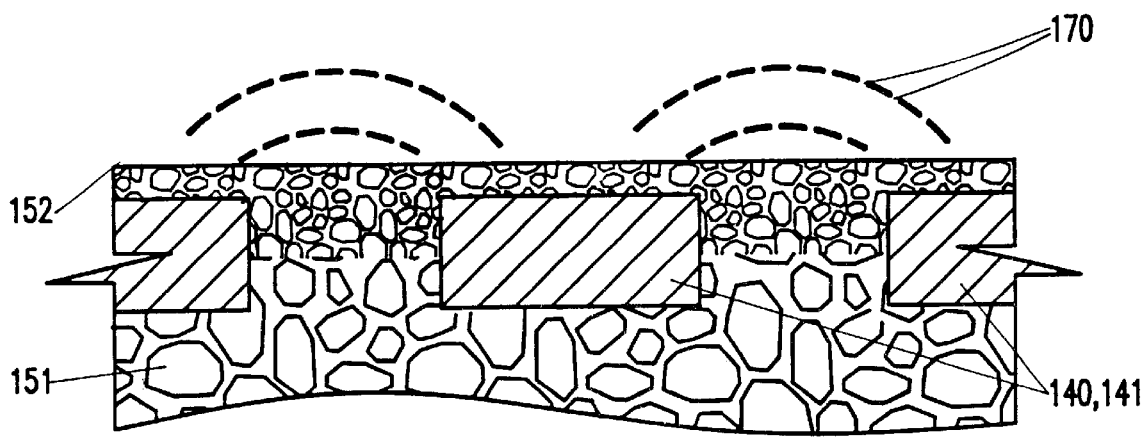
FIG. 18 is a schematic diagram of an enlarged side view of the capacitive fuse shown in FIG. 16.

FIGS. 17 and 18 offer a more detailed illustration of the upper fringe fields of the capacitors shown in FIGS. 15 and 16, respectively. The lower fringe fields remain essentially unchanged.

In FIG. 17, the fringe fields 170 extend into the densified material 152 which actually has a partially densified component 172 and a fully densified component 171. When compared to the porous material 151, the dielectric constant K in the densified material 171 increases from about 2.0 to about 3.5, which increases the capacitance.

In FIG. 18, the densified dielectric 171 is removed and the fringe fields 170 extend into air. When compared to the porous material 151, the dielectric constant K in air decreases from about 2.0 to 1.0, which decreases the capacitance.

Therefore, the embodiment of the invention shown in FIGS. 14–18 can be programmed (e.g., blown) to either increase capacitance or decrease capacitance. As with the first embodiment, the capacitance change can be sensed using sensing circuits, such as those discussed above.

Figure 19:
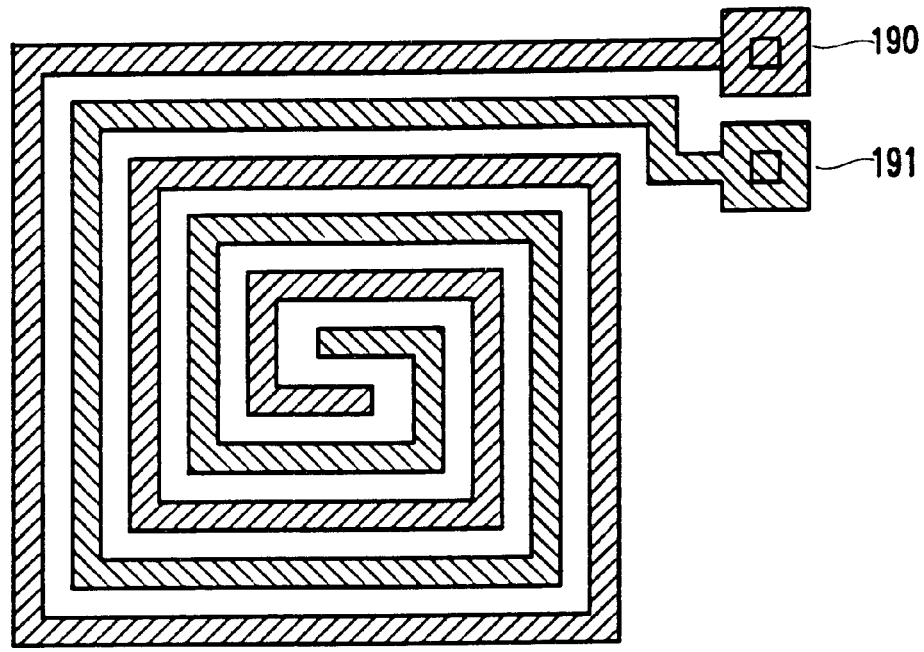
FIG. 19 is a schematic diagram of a top view of the capacitive fuse according to another embodiment of the invention.
Figure 20:
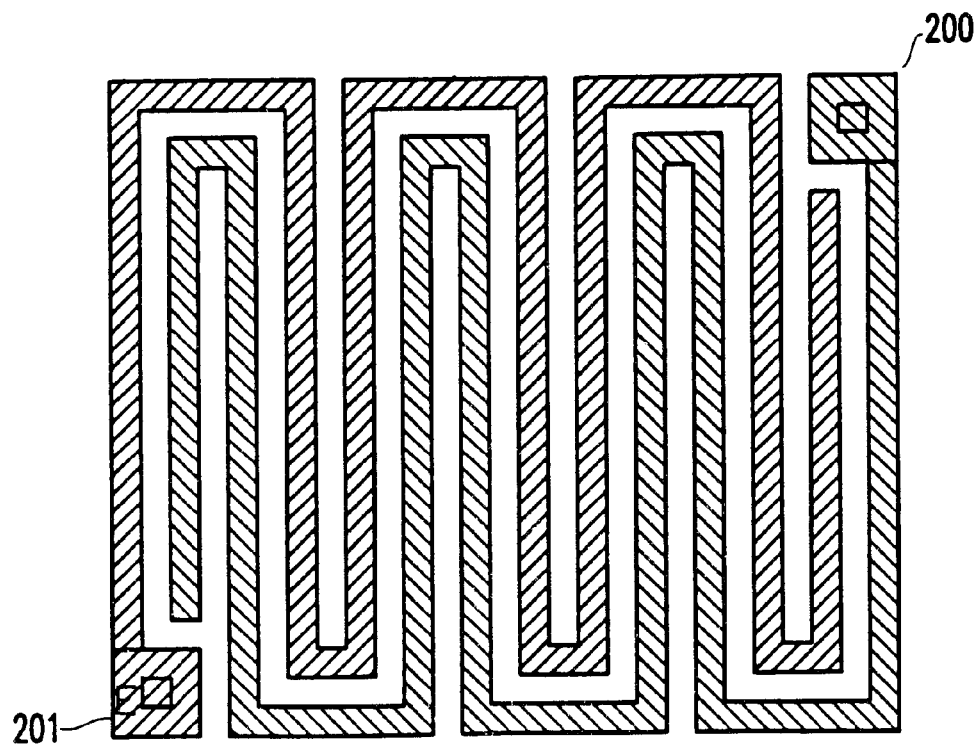
FIG. 20 is a schematic diagram of a top view of the capacitive fuse according to another embodiment of the invention.

Having the electrical fields intersect as many fingers 140, 141 as possible maximizes the effect of changes in the upper fringe fields 170, which makes an overall square shape (L=W) preferred. As would be known by one ordinarily skilled in the art given this disclosure, the invention is not limited to the foregoing structure. For example, FIGS. 19 and 20 illustrate alternative parallel spiral patterned capacitors. More specifically, FIG. 19 shows first 190 and second 191 plates laid out in a parallel spiral pattern and FIG. 20 shows first 200 and second 201 plates laid out in an interleaved serpentine pattern.

The capacitor structure illustrated in FIGS. 1–4 is insensitive to corrosion. When the link area is broken and the copper is left exposed, there is no dendritic growth because there is no direct current across the capacitor. If the exposed copper oxidizes or the upper plate material is removed, there is no impact to the remaining circuitry because the plate is physically isolated from the remainder of the wiring on the integrated circuit device.

Similarly, the capacitor structure illustrated in FIGS. 14–16 does not expose the copper and is also insensitive to corrosion. Therefore, there is no place for corrosion or dendritic growth to begin. These structures use the characteristics of the low K foam dielectrics (which are locally collapsed and changed into normal K dielectrics) to provide a difference in capacitance. The wires are not deleted, and the protective dielectric overcoat is only collapsed, not removed or destroyed.

In a similar manner to the structure illustrated in FIGS. 14–16, the capacitor structures illustrated in FIGS. 17–20 do not expose copper so there is no place for corrosion or dendritic growth to begin. These structures use the difference in the dielectric constants of the low K foam material and air to provide a difference in capacitance. The wires are not deleted, and the protective dielectric overcoat is not fully removed or destroyed.

The following embodiments shown in FIGS. 21–25 rely on breaking down a thin or narrow dielectric to complete a circuit to a capacitor. With the dielectric in place, an open circuit exists so no capacitance is sensed. With the dielectric broken down, a closed circuit will exist so that capacitance is sensed.

The embodiments shown in FIGS. 21–25 rely on building up enough voltage to break down the thin/narrow dielectric. More specifically, the voltage is generated by exposing a plate in an interlevel wiring layer to a charging source. Examples of such charging sources include E-Beams and Ion-Beams. Preferably, the charging processes are quick enough to blow many "fuses" per second.

Figure 21:
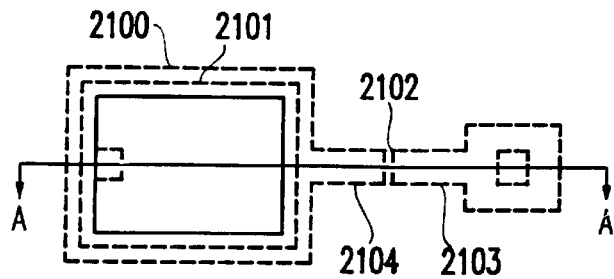
FIG. 21 is a schematic diagram of a top view of another embodiment of the invention.
Figure 22:
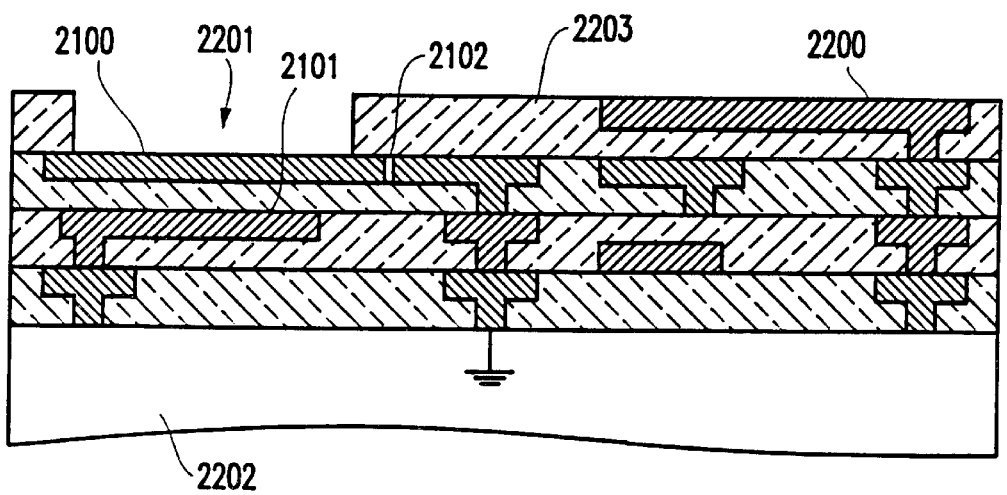
FIG. 22 is a schematic diagram of a cross-section of the structure shown in FIG. 21.

FIG. 21 is a top view, showing a capacitor having an upper plate 2100 and a lower plate 2101, with a gap 2102 formed in the same layer as the upper plate 2100. FIG. 22 is a cross section through AA of FIG. 21. Both a contact pad 2200 and a fuse structure 2201 are shown. The fuse 2201 can be seen to be formed of the upper capacitor plate 2100 which also serves as a beam collection target in last metal −1 layer and a lower plate 2101 formed in last metal −2 layer. The gap 2102 is formed in last metal −1 layer and one side 2104 is part of the upper plate 2100 and the other side 2103 is connected to ground. A dielectric 2203 is used to protect the structure, especially if the wiring is copper. The lower capacitor plate 2101 is connected to sense circuits 2202 for sensing the presence of a capacitor, as discussed above.

Therefore, with the dielectric 2102 in place, an open circuit exists so no capacitance is sensed. With the dielectric 2102 broken down, a closed circuit will exist so that capacitance of the capacitor 2100, 2101 is sensed by the sensing circuits 2202.

A typical gap 2102 distance is 0.1 to 0.2 m. However, as would be known by one ordinarily skilled in this art field given this disclosure, any gap distance could be used depending upon the specific application. With a low K dielectric, a 0.1 to 0.2 m gap distance would require a 100–200 volt field to breakdown. If the low K dielectric between the capacitor plates is much thicker (e.g, 0.5 to 1.0 m) the voltage field for breakdown must also be increased (e.g., 1000 volts). The breakdown of the gap 2102 must be lower than that of the capacitor. Exemplary conditions for charging the upper plate 2100 high enough to break down the gap 2102 are a current of 10 a and a voltage of 5 Kev applied for a time of 100 ns for an E-Beam, and a current of 1 na and a voltage of 25 Kev applied for 1 ms for an Ion Beam.

Figure 23:
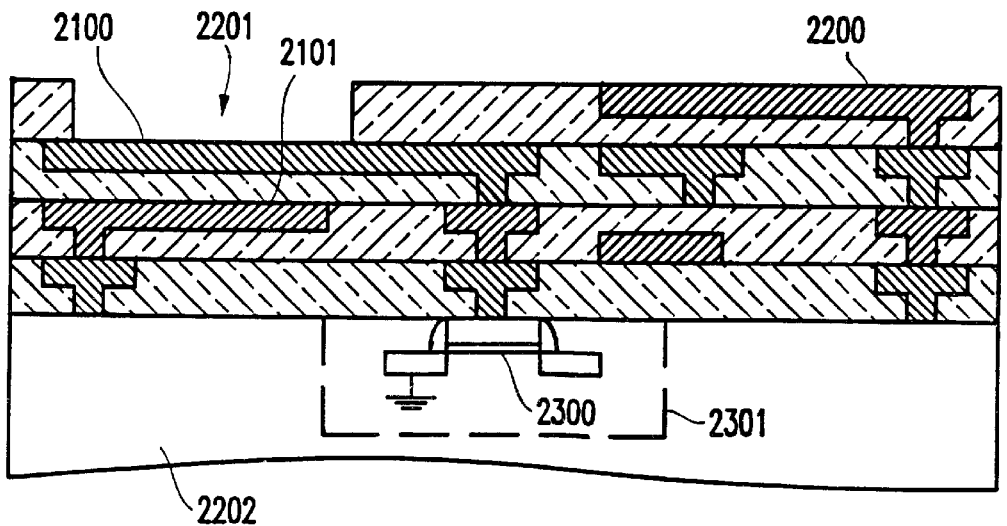
FIG. 23 is a schematic diagram of a cross-sectional view of another embodiment of the invention.
Figure 24:
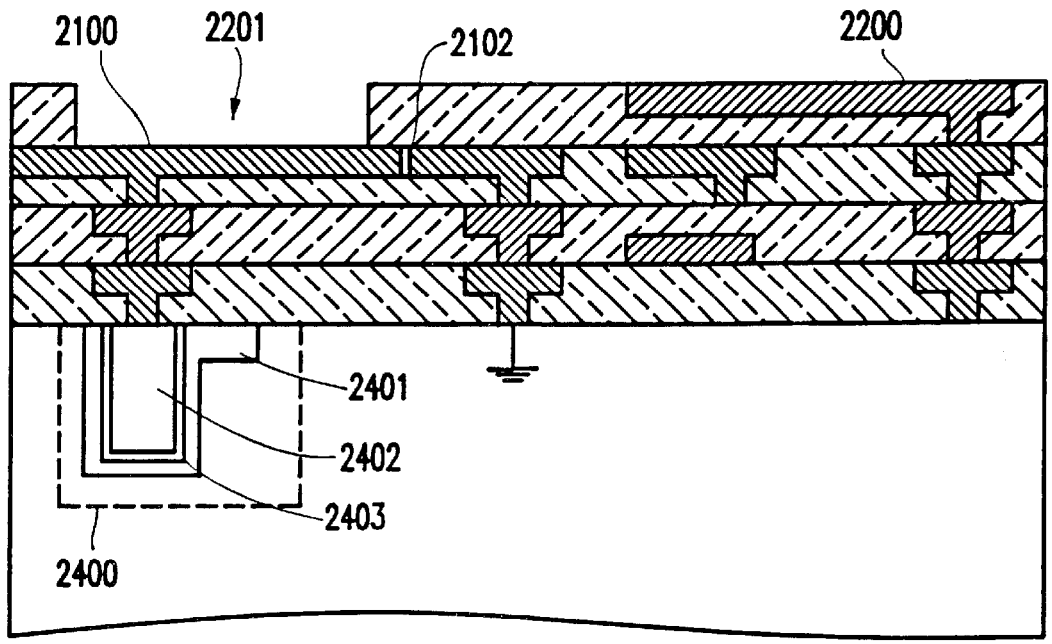
FIG. 24 is a schematic diagram of a cross-sectional view of another embodiment of the invention.

Another embodiment is shown in FIG. 23, which is a cross sectional view. In FIG. 23, the gap 2102 is replaced with a transistor 2301 (e.g, a field effect transistor FET). In this embodiment, the gate oxide 2300 of the transistor 2301 is broken down (e.g, made conductive) by application of sufficient voltage to the upper plate 2100. In this case, the typical gap distance (e.g., thickness of the gate oxide 2300) is approximately 0.02 to 0.1 m. However, as mentioned above, as would be known by one ordinarily skilled in this art field given this disclosure, any gap distance could be used depending upon the specific application. With oxide/nitride dielectrics, a gate oxide 2300 having a thickness of 0.02 to 0.1 m would require a 5 to 20 volt field to breakdown. The breakdown voltage of the FET gate structure 2300 is much lower than that of the capacitor 2100, 2101. Conditions for charging the upper plate 2100 high enough to breakdown the gate structure 2300 are a current of 10a and voltage of 5 Kev applied for 8 ns for an E-Beam, and a current of 1 na and voltage of 25 Kev applied for 8 s for an Ion Beam.

Figure 25:
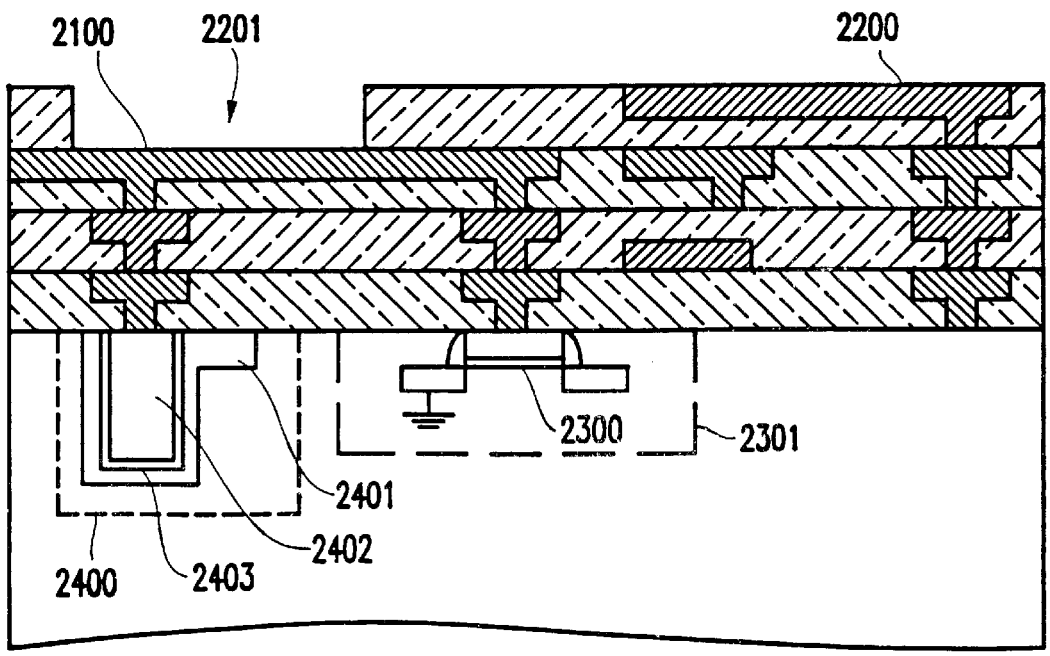
FIG. 25 is a schematic diagram of a cross-sectional view of another embodiment of the invention.

Another embodiment is shown in FIG. 24 which again is a cross sectional view similar to the structure shown in FIG. 22. However, in FIG. 24, the capacitor 2100, 2101 has been replaced with a trench capacitor 2400 having a diffusion region 2401 connected to sense circuits, a conductor 2402 (e.g., metal, alloy or polysilicon) and an insulator 2403. As mentioned above, the breakdown of the gap 2102 must be lower than that of the capacitor 2400. In FIG. 25, the gap 2102 is replaced with a transistor 2301 in a similar manner as was done in FIG. 23, discussed above.

While a pair of conductive wires 2103, 2104 separated by a dielectric 2102 and an FET device 2301 have been used as the "gap" that is to be shorted, as would be known to those ordinarily skilled in the art given this disclosure, other devices may be used, including other types of transistors such as Bipolar transistors and TFT's (Thin Film Transistor), diodes, and other types of capacitors such as thin film capacitors.

Therefore, with the invention, a circuit may be programmed by altering its capacitance. Further, the invention opens fusible links using an etching process which substantially reduces or eliminates the possibility of affecting structures adjacent the fusible link. This structure and process are superior to conventional fuses because very low level energy sources such as a low power laser, ultraviolet light or a reactive ion etching process can be utilized to blow the fuse. The energy level utilized by the invention does not cause the fuse material to explode or boil as conventional fuse and processes do. Therefore, blowing the fuse does not damage the surrounding dielectric material. Further, if any of the fuse material remains, it will not corrode or detract from the reliability of the remaining circuit.

Thus, the invention expands the usefulness of programmable and fusible devices and increases the manufacturing yield of circuits which include such devices.

While the invention has been described in terms of preferred embodiments, those skilled in the art will recognize that the invention can be practiced with modification within the spirit and scope of the appended claims.

What is claimed is:

1. A programming device comprising:

a first capacitor;

a fuse link connected to said first capacitor;

a second capacitor connected to said fuse link, wherein removing at least a portion of said fuse link changes a capacitance of said device; and a sensing circuit operatively connected to said first capacitor and said second capacitor, said sensing circuit being adapted to detect a change in said capacitance.

2. The device in claim 1, wherein said first capacitor includes a first top plate and said second capacitor includes a second top plate, wherein said first top plate, said second top plate and said fuse link are positioned in one planar conductive level within said device.

3. The device in claim 1, further comprising an insulator over said fuse link, said fuse link having a length greater than a width of a region formed by said insulator being opened with an energy light source.

4. The device in claim 1, wherein said first capacitor and said second capacitor comprise stacked capacitors.

5. The device in claim 1, wherein said first capacitor and said second capacitor comprise inter-digitated capacitors.

6. The device in claim 1, wherein said first capacitor and said second capacitor comprise parallel spiral patterned capacitors.

\* \* \* \* \*